United States Patent
Kim

(10) Patent No.: US 8,641,954 B2
(45) Date of Patent: Feb. 4, 2014

(54) METHOD FOR FABRICATING SOFT MOLD AND PATTERN FORMING METHOD USING THE SAME

(75) Inventor: Jin-Wuk Kim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 1192 days.

(21) Appl. No.: 11/819,934

(22) Filed: Jun. 29, 2007

(65) Prior Publication Data

US 2008/0000877 A1 Jan. 3, 2008

(30) Foreign Application Priority Data

Jun. 29, 2006 (KR) .................. 10-2006-0059969

(51) Int. Cl.
*B29C 33/40* (2006.01)
*B29C 67/00* (2006.01)
*B28B 7/36* (2006.01)

(52) U.S. Cl.
USPC ........... 264/255; 264/219; 264/220; 264/226; 264/227; 264/299; 264/319; 264/494; 264/496

(58) Field of Classification Search
USPC .......... 977/887; 264/219, 225, 496, 220, 226, 264/227, 299, 319, 494; 106/38.2
See application file for complete search history.

(56) References Cited

U.S. PATENT DOCUMENTS

| | | | | |
|---|---|---|---|---|
| 4,391,843 A | * | 7/1983 | Kaganowicz et al. | 427/490 |
| 6,265,461 B1 | * | 7/2001 | Urbano et al. | 522/111 |
| 6,515,069 B1 | * | 2/2003 | Gervasi et al. | 524/588 |
| 6,673,287 B2 | * | 1/2004 | Breen et al. | 264/83 |
| 6,957,608 B1 | * | 10/2005 | Hubert et al. | 101/483 |
| 2001/0000745 A1 | * | 5/2001 | Kerfeld | 430/320 |
| 2005/0172476 A1 | * | 8/2005 | Stone et al. | 29/592.1 |
| 2006/0012079 A1 | * | 1/2006 | Jung et al. | 264/338 |
| 2006/0105487 A1 | * | 5/2006 | Kim | 438/35 |

FOREIGN PATENT DOCUMENTS

WO     WO 2004090636 A1 * 10/2004

* cited by examiner

*Primary Examiner* — Atul P. Khare
(74) *Attorney, Agent, or Firm* — McKenna Long & Aldridge, LLP

(57) ABSTRACT

A method for forming a soft mold includes providing a master mold having at least one pattern thereon, forming pre-polymer layer on the master mold, applying water on the pre-polymer layer, hardening the pre-polymer layer to form a soft mold, removing water, and separating the soft mold from the master mold. A method for forming a pattern comprises forming a resist on an etching subject layer, providing a soft mold, disposing the soft mold on the resist, separating the soft mold from the resist to form the resist pattern, and etching the etching subject layer by using the resist pattern, wherein providing the soft mold comprises providing a master mold having at least one pattern thereon, forming pre-polymer layer on the master mold, applying water on the pre-polymer layer, hardening the pre-polymer layer to form a soft mold, removing water, and separating the soft mold from the master mold.

11 Claims, 3 Drawing Sheets

METHOD FOR FABRICATING SOFT MOLD AND PATTERN FORMING METHOD USING THE SAME

This application claims the benefit of Korean Patent Application No. 10-2006-0059969 on Jun. 29, 2006, which is hereby incorporated by reference for all purposes as if fully set forth herein.

BACKGROUND OF THE INVENTION

1. Field of the Invention

The present invention relates to a soft mold used for soft-lithography in fabricating a liquid crystal display (LCD) and a method for forming a pattern using the same.

2. Discussion of the Related Art

Recently, the importance of a display device as a visual information transmission medium is increasing, and various types of competitive display devices are being developed. In order to hold an important position, the display devices should meet the requirements of low power consumption, being thin and light and having high picture quality.

An LCD, a major product among the flat panel displays (FPDs), has mass-productivity as well as having performance to satisfy those requirements of the display, so it can be commonly employed in various application fields such as a large TV or a computer monitor, etc. and is taking hold as a core display device that may eventually replace the existing cathode ray tubes (CRTs) in the markets.

In general, the LCD is a display device in which data signals according to image information are individually supplied to liquid crystal cells arranged in a matrix form to control light transmittance of the liquid crystal cells to thus display desired images.

The construction of the related art LCD will now be described in detail with reference to FIG. 1.

As shown in FIG. 1, the general LCD includes a color filter substrate, an upper plate, a TFT (thin film transistor) array substrate, a lower plate, and a liquid crystal layer 109.

The color filter substrate includes a substrate 113, a color filter 117 formed on the substrate 113, a black matrix BM 115 formed between color filters 117, and a common electrode 111 formed on the color filters 117 and the BMs 115.

The TFT array substrate 101 includes a substrate 101, a pixel electrode formed at a pixel region (P) on the substrate 101, TFTs, switching elements, and array lines 103 and 105.

On the TFT array substrate 101, the gate lines 103 and data lines 105 are formed to cross each other to define the pixel regions (P), and the TFTs are formed at each crossing of the gate lines 103 and data lines 105. A pixel electrode 107 formed of a transparent conductive layer is formed on the pixel region P.

The liquid crystal layer 109 is formed between the color filter substrate and the TFT array substrate, and made of a liquid crystal material having photorefractive anisotropic qualities.

Although not shown, there may be other elements formed on the LCD, including polarizers attached on both surfaces of the liquid crystal panel, a backlight unit including a lamp and an optical sheets formed at a lower portion of the polarizer of the lower plate, and top and bottom cases that support the liquid crystal panel.

In fabricating most of the flat panel display devices including the LCD, a thin film material stacked on the substrates are patterned through a photolithography process. Patterning through the photolithography process will now be described.

First, photoresist, a photosensitive material, is coated on a thin film desired to be patterned, a photomask with a pattern is aligned thereon, and an exposing process is performed. In this case, the photomask includes transmission regions and a blocking regions. Light which has passed through the transmission region chemically changes the photoresist. The chemical change in the photoresist varies depending on a kind of photoresist. That is, a portion of a positive photoresist which has received light changes to have properties of being dissolved by a developer, and a portion of negative photoresist which has received light changes to properties of not being dissolved by the developed. Hereinafter, the positive photoresist will be described as an example.

The exposed portion of the photoresist in the exposing process is removed by using a developer to form a photoresist pattern on the thin film. Thereafter, the thin film is etched by using the photoresist pattern as a mask, and then, a remaining photoresist pattern is removed, to form a thin film with a certain pattern.

The photolithography process may be used three times to five times in the processes of forming a gate electrode, forming an active layer pattern, forming source and drain electrodes, forming a contact hole and forming the pixel electrode.

However, as mentioned above, the photolithography process requires the high-priced photomask and the complicate steps such as exposing and developing, resulting in excessive processing costs and difficulty in managing production yield.

SUMMARY OF THE INVENTION

Therefore, in order to address the above matters the various features described herein have been conceived. One aspect of the exemplary embodiments is to provide a method for forming a pattern by a soft-lithography process, instead of a photolithography technique, by providing a method for fabricating a soft mold used for a soft-lithography.

This specification provides a method for forming a soft mold including: providing a master mold having at least one pattern thereon, forming a pre-polymer layer on the master mold, applying water on the pre-polymer layer, hardening the pre-polymer layer to form a soft mold, removing water, and separating the soft mold from the master mold.

This specification also provides a method for forming a pattern including: forming a resist on an etching subject layer, providing a soft mold, disposing the soft mold on the resist, separating the soft mold from the resist to form the resist pattern, and etching the etching subject layer by using the resist pattern, wherein providing the soft mold comprises providing a master mold having at least one pattern thereon, forming pre-polymer layer on the master mold, applying water on the pre-polymer layer, hardening the pre-polymer layer to form a soft mold, removing water, and separating the soft mold from the master mold.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Exemplary embodiments may be better understood with reference to the drawings, but these examples are not intended to be of a limiting nature. Like numbered elements in the same or different drawings perform equivalent functions. When a specific feature, structure, or characteristic is described in connection with an example, it will be understood that one skilled in the art may effect such feature, structure, or characteristic in connection with other examples, whether or not explicitly stated herein.

Figure 1:
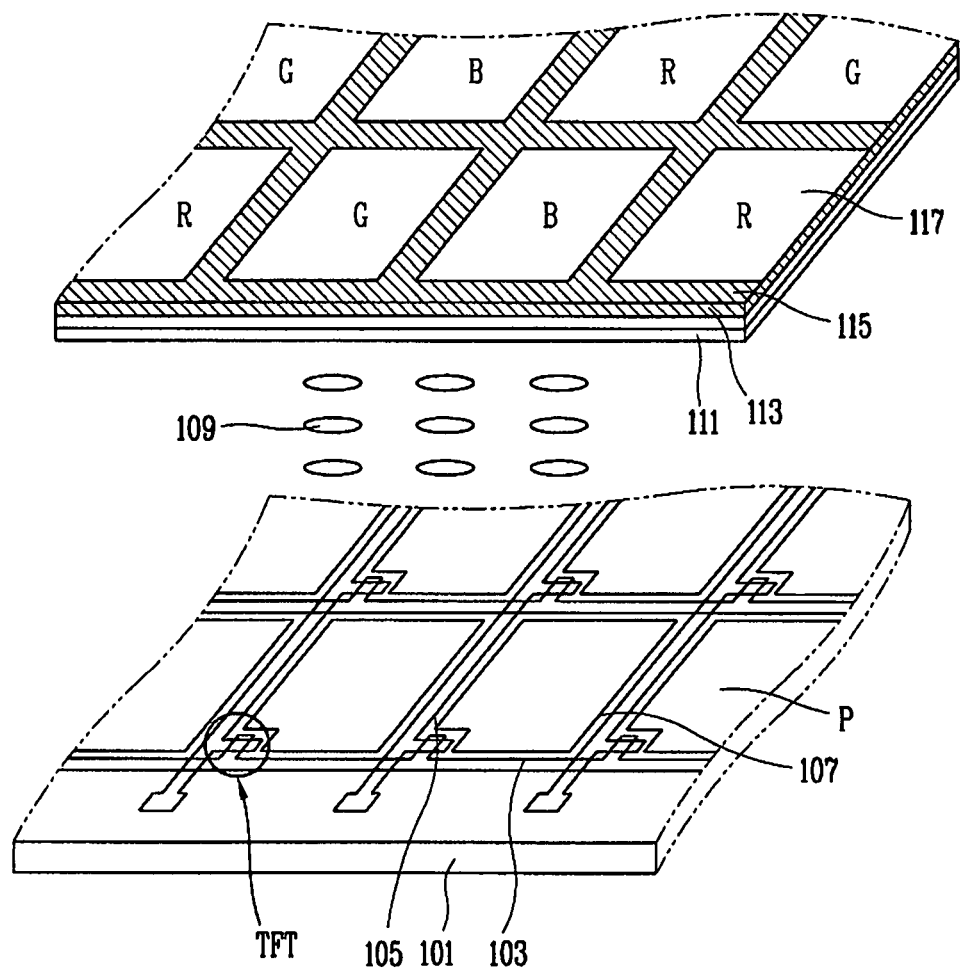
FIG. 1 is an exploded view of a general liquid crystal display.
Figure 2A:
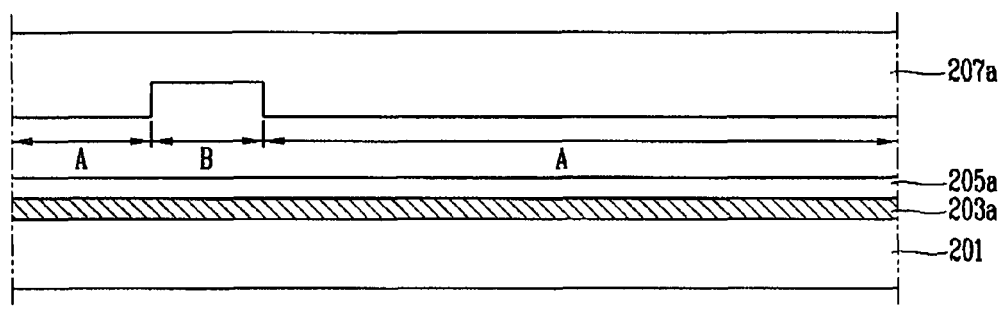
FIGS. 2a to 2c are sectional views sequentially showing a method for forming a thin film pattern according to an exemplary embodiment of the present invention.
Figure 2B:
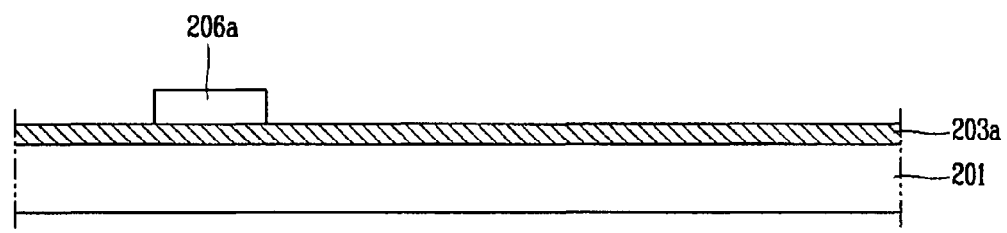
Figure 2C:
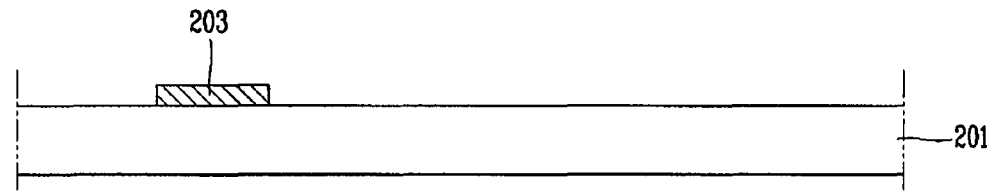

FIGS. 2a to 2c are sectional views sequentially showing a method for forming a thin film pattern by using soft-lithography according to an exemplary embodiment of the present invention. This method can be used for forming a thin film transistor array substrate of a liquid crystal display (LCD), which can form a pattern without using a photolithography process.

First, as shown in FIG. 2a, an etching subject layer 203a is formed on a substrate 201, and a resist (as known as 'etch resist' in this case) 205a is formed with a liquid resin on the subject layer 203a.

Then, a soft mold 207a having at least one pattern which is consisting of a depressed pattern (B) and an embossed pattern (A) is disposed on the resist 205a.

The soft mold 207a is disposed to correspond to a portion where a pattern is to be formed. The embossed pattern (A) is contacted with the resist 205a and then pressed. Then, the resist 205a, which is a resin in a liquid state (i.e., a liquefied resin), flows (or moves, travels, etc.) to the depressed pattern (B) of the soft mold 207a because of a capillary action and a repulsive force between the soft mold and the resist.

Thereafter, when a certain time lapses, the soft mold 207a is separated from the resist to form a resist pattern 206a. Then, the resist pattern 206a remains on the etching subject layer 203a, wherein the resist pattern 206a has the same shape as that of the depressed pattern (B) as shown in FIG. 2A.

Next, as shown in FIG. 2c, the etching subject layer 203a is etched by using the resist pattern 206a as a mask, and then, the resist pattern 206a is removed to complete a thin film pattern 203.

The above-described soft-lithography process is continuously applied for a follow-up process, and the process is incorporated herein in their entirety.

The fabrication method of a soft mold will now be described with reference to FIGS. 3a to 3e.

Figure 3A:
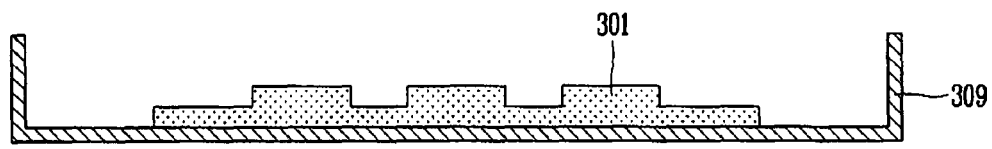
FIGS. 3a to 3e are sectional views illustrating the processes of a method for fabricating a soft mold according to an exemplary embodiment of the present invention.

First, as shown in FIG. 3a, a master mold 301 is prepared in a container 309. The master mold 301 includes a main body and at least one pattern with a depressed portion and an embossed (or protruded) portion on the main body.

The main body may be a glass plate or a body formed by stacking a metallic layer(s) on a glass plate. The material of the pattern may be a metal, silicon oxide, silicon nitride, photoresist, wax, etc. In particular, the material of the certain pattern can be Novolac™ resin. The pattern may be formed by a photolithographic process.

Figure 3B:
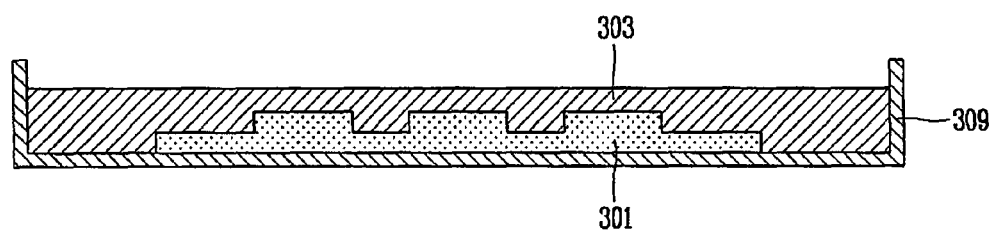

Next, as shown in FIG. 3b, a pre-polymer layer 303 is formed on the master mold. Pre-polymer is used as the material of the soft mold, and the pre-polymer layer 303 may be formed by pouring the pre-polymer on the master mold 301. As the pre-polymer, PDMS (Polydimethylsiloxane) containing fluorine (F) may be used.

Figure 3C:
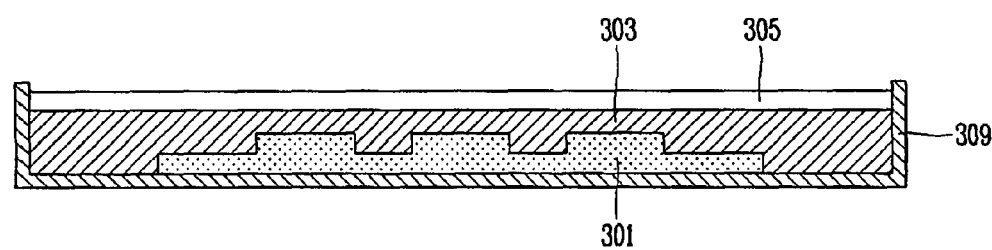

After the pre-polymer layer 303 is formed on the master mold 301, as shown in FIG. 3c, water 305 is applied onto the pre-polymer layer 303 when the pre-polymer is in a gel state. Namely, the water 305 is applied onto the pre-polymer layer 303 after soft-hardening the pre-polymer layer 303 in a gel state. It means the pre-polymer layer 303 has not been completely cured yet when the water 305 is applied.

Figure 3D:
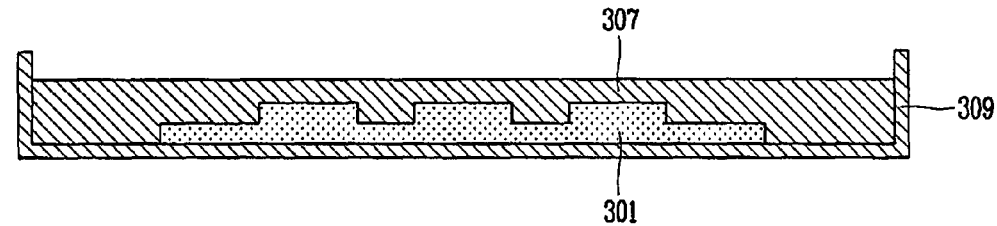

And then, as shown in FIG. 3d, the pre-polymer layer 303 is hardened (or cured) at a room temperature. And, the water 305 is removed. In the process of hardening the pre-polymer, the pre-polymer can be cured by leaving it at a room temperature, or can be heated, or light can be irradiated thereto as necessary. After hardening, the pre-polymer layer 303 become a soft mold 307.

Figure 3E:
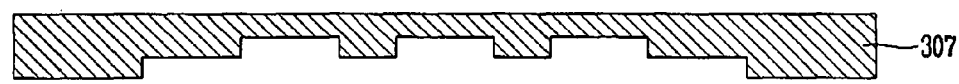

Finally, as shown in FIG. 3e, the soft mold 307 is separated from the master mold 301 to complete a soft mold 307.

The method of fabricating the soft mold further comprises a step of attaching a back plate to a rear surface of the soft mold 307 before the soft mold 307 is separated from the master mold 301. The step of separating the soft mold 307 from the master mold 301 is performed such that the back plate and the soft mold are integrally separated from the master mold, and in this case, because the back plate secures and fixes the soft mold, the soft mold may be easily separated from the master mold. Preferably, the back plate can be made of one of glass or PET (Polyethylene Terephthalate).

When the soft mold 307 is fabricated in such a manner as described above, a certain pattern formed on the master mold 301 is transferred to a surface of the soft mold 307.

In this respect, in fabricating the soft mold, the adhesion between the master mold and the soft mold is a concern in the process of separating the soft mold from the master mold. That is, when separating the soft mold from the master mold, a portion of the soft mold may not be separated from the master mold due to adhesion between the master mold and the soft mold, causing a defective pattern on the soft mold. In particular, because of the adhesion characteristics between the pre-polymer and the master mold, it may be difficult to separate the soft mold from the master mold after the soft mold is cured. Thus it may cause some defects.

For these reasons, in the present invention, a hydrophobic group such as fluoride is contained in the pre-polymer, the material of the soft mold, to thus weaken the adhesion between the contact surfaces of the master mold and the soft mold.

As the pre-polymer, PDMS (Polydimethylsiloxane), polyurethane or polyimide, etc., can be used, and preferably, Sylgard 184, etc., of Dow Corning Co., a kind of PDMS, can be used.

In the present invention, in order to introduce fluorine into the pre-polymer, $CF_3(CF_2)_n CH=CH_2$, a fluoride compound, is contained together with PDMS in the pre-polymer so as to be cured. In this case, preferably, the amount of the fluoride compound is about 0.01 wt %~5 wt %. As the curing is proceeding, the fluoride compound is introduced to side chains of polymer.

However, when fluoride compound mixed with PDMS is added to the master mold to form a pre-polymer layer, a problem arises in that the fluoride compound causes formation of the fluoride side chains on the pre-polymer surface portions that contact with (i.e., is exposed to) air, but not on the pre-polymer surface portions that contact with the master mold.

Namely, assuming that the contact surface of the pre-polymer to the master mold with a pattern is a front surface of the pre-polymer while the opposite side of the pre-polymer to air without a pattern is a rear surface, the hydrophobic fluoride side chain is formed on the rear surface of the pre-polymer rather than the front surface. However, the fluoride side chain should be formed on the front surface, namely, the contact surface with the master mold in order to allow the soft mold to be smoothly separated from the master mold.

This is because the master mold has a surface energy of 50 mN/m or more, while the fluoride compound and pre-polymer have a surface tension of 15 mN/m or less and a surface energy lower than that of the master mold. The fluoride compound and pre-polymer would rather make contact with air (i.e., causing the side chain to be formed on the rear surface of the pre-polymer layer) instead of on the master mold, in terms of energy.

In addition, because fluoride compound has a smaller density than PDMS and has volatility, the smaller density and the volatility cause the fluoride compound to form on the rear surface of the pre-polymer layer 303.

For these reasons, the introduction of hydrophobic fluoride compound into the pre-polymer may fail to fully obtain the intended effects.

Thus, in an effort to solve such problems, in the present invention, the rear surface of the pre-polymer layer 303 is made to have a high surface energy. By making the rear surface of the pre-polymer layer 303 have such high surface energy, the fluoride compound may be formed to the front surface of the pre-polymer layer with the relatively smaller surface energy by a repulsive force, and accordingly, the introduction of fluoride compound to the rear surface can be prevented.

There can be several materials having a repulsive force to the fluoride compound. However among them, if a solid material with high surface energy is used in a state that the pre-polymer is not cured yet, the material may sink below the liquid pre-polymer layer or the interface between the pre-polymer, and the fluoride compound may be uneven. Thus, a material which is a liquid, that does not mix with the pre-polymer, and has high surface energy is preferred.

Water will not mix with the pre-polymer and has liquid phase; Therefore, water is preferably used as the material. Water can be applied onto the pre-polymer layer to have the desired effects in the present invention. Water has a surface energy of about 72.8 mN/m. So, in the presence of a layer of water, the repulsive force of the fluoride compound layer becomes stronger with respect to the water layer than with respect to the master mold, resulting in fluoride compound being moved to the rear surface.

The movement of fluoride compound can be explained in terms of repulsive forces. Assuming that there are two materials 1 and 2, and if an interface repulsive force is $\gamma_1$ and $\gamma_2$, a dispersion term is $\gamma^d$, and a polar them is $\gamma^p$, a mutual interface repulsive force $\gamma_{12}$ on the mutual contact surfaces can be defined as follows:

$$\lambda_{12} = \gamma_1 + \gamma_2 - 2(\gamma_1^d \lambda_2^d)^{1/2} - 2(\gamma_1^p \gamma_2^p)^{1/2}$$

The following Table 1 shows the repulsive forces between water and the fluorine compound, and between the Novolac™ resin of the master mold and fluoride compound by applying the above equation expressing the repulsive force on the mutual contact surfaces, in which water or the Novolac™ resin is assumed to be material 1 and fluoride compound is assumed to be material 2.

TABLE 1

|  | $\gamma^d$ | $\gamma^p$ | $\gamma_{12}$ |
|---|---|---|---|
| Water (1) | 21.8 | 51 | Water-fluorine chain: 50.65 |
| Novolac ™ (1) | 42 | 8 | Novolac ™-Fluorine chain: 14.14 |
| Fluorine chain (2) | 16 | 0 | |

The repulsive force between water and the fluoride compound is calculated by using the above equation to be about 50.65. The repulsive force between the Novolac™ resin and fluoride compound is calculated, by using the above equation, to be about 14.14.

Namely, because the fluoride compound has the stronger repulsive force with water than with the Novolac™ resin forming the master mold, it moves to the surface contacting the master mold rather than to the surface contacting the water layer in the pre-polymer. That means that, when the pre-polymer is cured, the fluoride compound can be introduced to the front surface of the pre-polymer. And accordingly, the cured pre-polymer layer including the fluoride compound to side chains, namely a soft mold, can be easily separated from the master mold.

Meanwhile, when applying water in the course of forming the soft mold, water is applied onto the pre-polymer layer when the pre-polymer is slightly cured to be in a gel state. The pre-polymer is in a liquid state having mobility, so in this state, if water is applied, because water has high surface energy, it thrusts the pre-polymer to thus increase the possibility of contacting the master mold. As a result, it is preferred that water is applied when the pre-polymer is in the gel state with a suitable degree of hardness. At this time, after the pre-polymer is poured in the master mold to form the pre-polymer layer, and in this state, when a certain time lapses at a room temperature, the gel can be obtained.

In the step of providing the master mold, fluorine can be introduced to the master mold. Fluorine or a compound containing fluorine can be introduced into the master mold such that a material containing fluorine is plasma-processed and such that a material containing fluorine is reacted with the resin of the master mold, thereby forming a self-assembled monolayer.

As so far described, the soft mold fabricating method and the method for forming a pattern by using the soft mold according to the present invention have the following advantages.

First, the processing costs can be reduced and the production yield can be improved by using the soft-lithography instead of the photolithography.

Second, because water is used to fabricate the soft mold, the fluoride compound can be effectively introduced into the soft mold, so a defect rate in fabrication the soft mold can be reduced.

Third, the thin film patterning step can be used in the step of forming the gate electrode, the active layer pattern, the source and drain electrodes, and the pixel electrode, and in the step of forming the color filters or black matrixes.

The thin film pattern forming step can be used in the step of fabricating an OLED (Organic Light Emitting Diode) or other flat display panels as well as the LCD.

Thus, the present invention is not limited to the above descriptions, and can be used together with the photolithography in the step of forming various patterns.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A method for fabricating a soft mold comprising:
    forming a master mold in a container, the master mold having side surfaces and a patterned upper surface;
    introducing a pre-polymer mixture into the container to cover the patterned upper surface and the side surfaces of the master mold, the pre-polymer mixture having a hydrophobic compound;
    soft-hardening the introduced pre-polymer mixture to form a pre-polymer gel, a front surface of the pre-polymer gel contacting the patterned upper surface of the master mold and a rear surface of the pre-polymer gel opposing the front surface being exposed to air;
    applying water onto the rear surface of the pre-polymer gel to increase surface energy at the rear surface beyond a surface energy at the front surface of the pre-polymer gel, thereby moving the hydrophobic compound to the front surface of the pre-polymer gel;
    hardening the pre-polymer gel while said water remains on the rear surface thereof to form a patterned soft mold;
    removing the water from the soft mold; and
    separating the soft mold from the master mold.

2. The method of claim 1, wherein the hydrophobic compound comprises fluorine (F).

3. The method of claim 2, wherein the hydrophobic compound is $CF_3(CF_2)_nCH=CH_2$ and the pre-polymer is PDMS (polydimethylsiloxane), where $2 \leq n \leq 15$.

4. The method of claim 3, wherein the hydrophobic compound is approximately 0.01 wt % to 5 wt % of the mixture.

5. The method of claim 1, wherein said hardening takes place at room temperature.

6. The method of claim 1, wherein said hardening takes place by increasing temperature.

7. The method of claim 1, further comprising:
    attaching a back plate to a rear surface of the soft mold before said separating; and
    conducting said separating by integrally separating the back plate and the soft mold from the master mold.

8. The method of claim 7, wherein the back plate is made of one of glass or PET (polyethylene terephthalate).

9. The method of claim 1, wherein providing the master mold comprises:
    initially forming a main body of the master mold; and
    forming the pattern of the patterned upper surface on the main body.

10. The method of claim 1, further comprising plasma-processing the master mold with a compound containing fluorine before said introducing of the pre-polymer mixture.

11. The method of claim 10, wherein said plasma-processing forms a self-assembled monolayer on the master mold.

* * * * *